(12) United States Patent
Zhang et al.

(10) Patent No.: US 7,599,173 B2
(45) Date of Patent: Oct. 6, 2009

(54) SYSTEMS, DEVICES, AND METHODS FOR SECURING COVERS

(75) Inventors: Fan Zhang, Suwanee, GA (US); James Tirrell, Grayson, GA (US)

(73) Assignee: Siemens Energy & Automation, Inc., Alpharetta, GA (US)

( * ) Notice: Subject to any disclaimer, the term of this patent is extended or adjusted under 35 U.S.C. 154(b) by 0 days.

(21) Appl. No.: 11/381,640

(22) Filed: May 4, 2006

(65) Prior Publication Data

US 2006/0285281 A1 Dec. 21, 2006

Related U.S. Application Data

(60) Provisional application No. 60/690,815, filed on Jun. 15, 2005.

(51) Int. Cl.
*H02B 1/26* (2006.01)
*H02B 1/00* (2006.01)

(52) U.S. Cl. .................. 361/667; 361/659; 361/664; 361/641; 361/665; 361/672

(58) Field of Classification Search .............. 439/212, 439/508; 361/622–624, 659–672, 601, 627, 361/641

See application file for complete search history.

(56) References Cited

U.S. PATENT DOCUMENTS

| | | | | |
|---|---|---|---|---|
| 2,182,603 | A * | 12/1939 | Walker et al. ............... | 361/667 |
| 3,087,097 | A * | 4/1963 | Janson ........................ | 361/659 |
| 3,247,337 | A * | 4/1966 | Wiegel ...................... | 200/43.22 |
| 3,361,283 | A * | 1/1968 | Nicholson ................. | 220/3.8 |
| 3,479,104 | A * | 11/1969 | Kobryner ................... | 312/229 |
| 3,585,456 | A * | 6/1971 | Phillips, Jr. ................ | 361/663 |
| 3,591,835 | A * | 7/1971 | Sloop ........................ | 361/672 |
| 3,716,762 | A * | 2/1973 | Shrader ..................... | 361/670 |
| 3,912,348 | A * | 10/1975 | Seymour ................... | 312/100 |
| 4,080,644 | A * | 3/1978 | Reed et al. ................. | 361/653 |
| 4,153,176 | A | 5/1979 | Carson | |
| 4,404,521 | A * | 9/1983 | Fennell ..................... | 324/110 |
| 4,720,675 | A | 1/1988 | Bishop | |
| 4,747,016 | A * | 5/1988 | Sloop, Sr. .................. | 361/672 |
| 4,872,847 | A * | 10/1989 | Fennell et al. ............. | 439/133 |
| 5,088,004 | A * | 2/1992 | Howell ...................... | 361/669 |
| 5,341,273 | A * | 8/1994 | Sharp et al. ................ | 361/641 |
| 5,404,266 | A * | 4/1995 | Orchard et al. ............ | 361/667 |
| 5,418,683 | A * | 5/1995 | Orchard et al. ............ | 361/672 |
| 5,638,256 | A * | 6/1997 | Leach et al. ............... | 361/641 |
| 5,669,703 | A | 9/1997 | Wheeler | |
| 5,870,276 | A * | 2/1999 | Leach et al. ............... | 361/627 |
| 5,886,868 | A * | 3/1999 | White et al. ............... | 361/652 |
| 6,254,437 | B1 * | 7/2001 | Carroll et al. ............. | 439/709 |
| 6,266,233 | B1 * | 7/2001 | O'Regan ................... | 361/659 |
| 6,280,805 | B1 * | 8/2001 | Markovich ................ | 428/34.1 |

(Continued)

*Primary Examiner*—Jayprakash N Gandhi
*Assistant Examiner*—Bradley H Thomas
(74) *Attorney, Agent, or Firm*—Jose de la Rosa

(57) ABSTRACT

Certain exemplary embodiments comprise a system comprising an enclosure structure configured to restrict access to an electrical meter. The system can comprise a meter cover configured to cover and/or restrict access to the meter. One of the meter cover and the enclosure structure can comprise an opposing pair of prongs. Each of the prongs can be configured to be received by a corresponding dogleg slot from a pair of dogleg slots. Each of the prongs, when engaged with the corresponding dogleg slot, can be configured to restrain motion of the meter cover.

18 Claims, 9 Drawing Sheets

U.S. PATENT DOCUMENTS

| | | | |
|---|---|---|---|
| 6,421,229 B1 * | 7/2002 | Campbell et al. | 361/622 |
| 6,486,399 B1 * | 11/2002 | Armstrong et al. | 174/58 |
| 6,734,663 B2 | 5/2004 | Fye | |
| 6,784,385 B2 * | 8/2004 | Hernandez-Perez | 200/50.33 |
| 6,823,563 B2 * | 11/2004 | Robinson et al. | 16/422 |
| 6,904,688 B1 | 6/2005 | Henry | |
| 6,959,972 B2 * | 11/2005 | Cude et al. | 312/329 |
| 7,075,003 B2 * | 7/2006 | Johnson et al. | 174/50 |
| 7,176,376 B2 * | 2/2007 | Stachowiak, Jr. | 174/50 |
| 2003/0025493 A1 | 2/2003 | Fye | |
| 2003/0184956 A1 * | 10/2003 | Robinson et al. | 361/659 |
| 2003/0227179 A1 | 12/2003 | Mardis | |

* cited by examiner

6000

8000

SYSTEMS, DEVICES, AND METHODS FOR SECURING COVERS

CROSS-REFERENCE TO RELATED APPLICATIONS

This application claims priority to, and incorporates by reference herein in its entirety, pending U.S. Provisional Patent Application Ser. No. 60/690,815, filed 15 Jun. 2005.

BACKGROUND

U.S. Pat. No. 5,669,703 (Wheeler), which is incorporated by reference herein in its entirety, allegedly recites a "push-in bulb base for use in a bayonet-type bulb socket. The push-in base does not require turning of the bulb base to engage the retaining bayonets of the bulb base in the L-shaped retaining slot of the bulb socket. The push-in bulb base has integrally formed flexible retainers which flex inward during installation and then flex back to their normal position to engage the L-shaped retaining slots of the bulb socket. An integrally formed alignment rib prevents the bulb base from being inserted into the bulb socket in a position that would prohibit the engagement of the retainer with the L-shaped retaining slot." See Abstract.

U.S. Pat. No. 6,904,688 (Henry), which is incorporated by reference herein in its entirety, allegedly recites a "sight protective cover system adapted for a target sight including a protective cover. The protective cover being a body having at least two L-shaped slots. Also, including a mounting section which has a protective cover insert extending outward from the mounting section and away from the target sight, where the protective cover insert is sized to fit inside the body of the protective cover. There are at least two studs extending from the protective cover insert to interact with the at least two L-shaped slots to lock the mounting section and the protective cover together. There is a spring member between the mounting section and the protective cover to provide tension between the at least two studs and the at least two L-shaped slots to aid in locking the mounting section and the protective cover together." See Abstract.

SUMMARY

Certain exemplary embodiments comprise a system comprising an enclosure structure configured to restrict access to an electrical meter. The system can comprise a meter cover configured to cover the meter port. One of the meter cover and the enclosure structure can comprise an opposing pair of prongs. Each of the prongs can be configured to be received by a corresponding dogleg slot from a pair of dogleg slots. Each of the prongs, when engaged with the corresponding dogleg slot, can be configured to restrain motion of the meter cover.

BRIEF DESCRIPTION OF THE DRAWINGS

A wide variety of potential practical and useful embodiments will be more readily understood through the following detailed description of certain exemplary embodiments, with reference to the accompanying exemplary drawings in which.

DEFINITIONS

Figure 1:
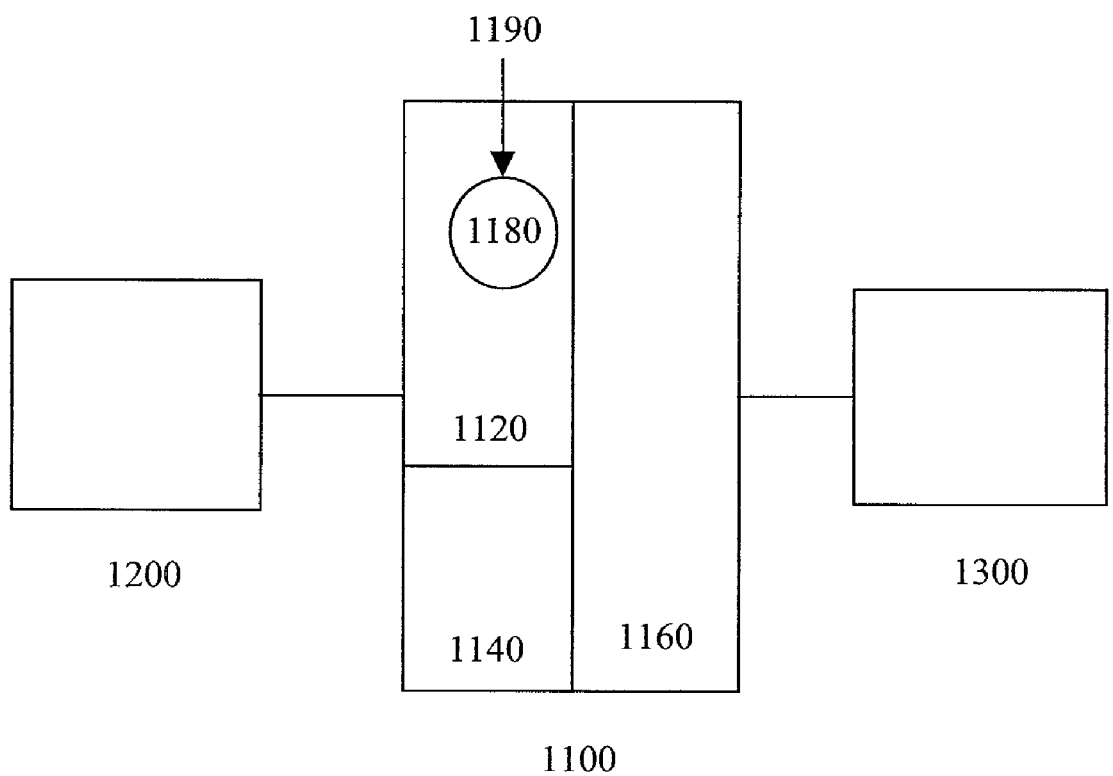
FIG. 1 is a perspective view of an exemplary embodiment of a system 1000.

When the following terms are used substantively herein, the accompanying definitions apply:

a—at least one.

access—to obtain a means of entry into.

activity—an action, act, step, and/or process or portion thereof.

adapted to—made suitable or fit for a specific use or situation.

adapter—a device used to effect operative compatibility between different parts of one or more pieces of an apparatus or system.

and/or—either in conjunction with or in alternative to.

apparatus—an appliance or device for a particular purpose approximately—nearly the same as.

associated with—related to.

axis—a straight line serving to orient a space or a geometric object.

base—a portion farthest away from a defined opening.

base panel—an object configured to receive an electrical meter, the object configured to be mounted in an enclosure structure.

can—is capable of, in at least some embodiments.

chamfered opening—one or more beveled surfaces defining an entryway to a passage.

comprising—including but not limited to.

configured to—capable of performing a particular function.

connect—to join or fasten together.

corresponding—related, accompanying, and/or similar especially in position.

coupleable—capable of being joined, connected, and/or linked together.

coupling—linking in some fashion.

cover—a substantially planar object configured to protect and/or conceal.

define—to establish the outline, form, or structure of.

details—particulars considered individually and in relation to a whole.

device—a machine, manufacture, and/or collection thereof.

diameter—a thickness of an elliptical object.

direction—a distance independent relationship between two points in space that specifies the position of either with respect to the other; the relationship by which the alignment or orientation of any position with respect to any other position is established.

dogleg slot—an offset, angled, and/or substantially "L"-shaped channel defining a first axis between a vertex and a centerline of an opening of the channel, the offset channel defining a second axis between the vertex and a base centerline of the offset channel, the first axis intersecting the second axis at an angle of less than approximately 180 degrees, such as between approximately 45 degrees and approximately 135 degrees, approximately 60 degrees and approximately 120 degrees, and/or approximately 75 degrees and approximately 105 degrees, approximately 85 degrees and approximately 95 degrees, etc., including all values and sub-ranges therebetween.

electrical meter—an assembled system configured to measure a usage of electrical energy.

electrical wire—insulated strands of an electrically conductive metal.

enclosure structure—a housing configured to contain an electrical meter.

engage—to interlock.

fastener—a restraint that attaches to something and/or holds something in place. A fastener can be a screw, bolt, hook and/or loop of a hook and loop fastener system, button, hook, catch, snap, latch, buckle, loop, tie, clamp, connector, coupler, link, band, zipper, releasable adhesive, plug and socket, and/or any other releasable means for attachment, and/or a glue, bond, weld, and/or any other permanent means for attachment install—to connect or set in position and prepare for use.

longitudinal axis—a straight line defined parallel to an object's length and passing through a centroid of the object.

may—is allowed and/or permitted to, in at least some embodiments.

meter access side—a substantially planar surface of an enclosure structure configured to allow a person access to an electrical meter comprised in the enclosure structure.

meter cover—a device configured to shield a meter from an intrusion.

meter port—an opening through which an electrical meter can be viewed and/or accessed.

method—a process, procedure, and/or collection of related activities for accomplishing something.

motion—changing position or place.

mount—to attach to something.

mounting bracket—a weight bearing and/or motion restraining structural component configured to attach a first thing to a second thing.

move—to change a position or place.

obtain—to receive, calculate, determine, and/or compute.

opening—an open space serving as a passage or gap.

opposing surface—a surface opposite to and/or pointing or facing away from another surface.

pair—a quantity of two of something.

panel cover—a device configured to shield a panel from an intrusion.

parallel—of, relating to, or designating curves or surfaces everywhere equidistant.

percent—one part in one hundred.

perpendicular—substantially at a right angle with respect to an axis.

place—(v.) to put in a particular position.

plane—a substantially flat surface.

plurality—the state of being plural and/or more than one.

position—(n.) a place or location.

predetermined—established in advance.

prong—a projecting part, such as a protrusion, bar, stub, rod, pin, cylinder, etc.

prong axis—a straight line substantially parallel to, and substantially collinear with, a longitudinal axis of a prong.

provide—to furnish and/or supply.

receive—to take, get, acquire, and/or have bestowed upon.

relative—with reference to.

releasably attach—to fasten together in a manner that allows for substantially non-destructive unfastening.

remove—to move from a place or position occupied.

repeatedly—again and again; repetitively.

responsive—reacting to an influence and/or impetus.

restrain—to limit and/or restrict.

restrict—to keep within limits.

rotational—about and/or around an axis.

set—a related plurality.

side—a surface bounding a solid object.

substantially—to a great extent or degree.

substantially—to a great extent or degree.

support—to bear the weight of, especially from below.

supporting surface—a boundary of a material configured to bear a weight of a predetermined object.

system—a collection of mechanisms, devices, data, and/or instructions, the collection designed to perform one or more specific functions.

ten percent—an amount defined by ten parts out of one hundred.

vertex—an area at which two defined regions intersect.

via—by way of and/or utilizing.

wider—greater in extent from side to side.

DETAILED DESCRIPTION

Certain exemplary embodiments comprise a system comprising an enclosure structure configured to restrict access to an electrical meter. The system can comprise a meter cover configured to cover the meter port. One of the meter cover and the enclosure structure can comprise an opposing pair of prongs. Each of the prongs can be configured to be received by a corresponding dogleg slot from a pair of dogleg slots. Each of the prongs, when engaged with the corresponding dogleg slot, can be configured to restrain motion of the meter cover.

A cover securing means can feature a pair of prongs. The prongs can be shoulder rivets, screws, rods, cylinders, machined rods with caps, screws, bolts, and/or bolts with nuts, etc. The pair of prongs can be on both sides of a meter cover inserting into corresponding dogleg slots in an enclosure structure. When engaged corresponding dogleg slots, the pair of prongs can prevent the meter cover from being lifted up. Certain exemplary embodiments can comprise a fastener and/or latch to secure the cover to the enclosure structure. A direction of the receiving slot can be determined by a direction desired to slide the cover to a desired secure position. A cover securing means can comprise a prong attached to a cover that interfaces with the corresponding dogleg slot in a side wall of the enclosure structure.

For meter sockets or meter systems with a separate meter cover and a pull section cover, a desire for security can make an overlap between two adjacent covers desirable. In certain exemplary embodiments, it might not be desirable to lift the meter cover open more than approximately ¼". In certain exemplary embodiments, various combinations of cover brackets and fasteners can be utilized.

Cover brackets, which can be located inside of cover meter openings, can be utilized for relatively small covers to resist meter cover lifting. For wider or longer covers, side brackets or other securing means can be utilized. In certain exemplary embodiments, spacing and assessment can be considered in positioning cover brackets.

Certain exemplary embodiments provide a securing configuration for meter covers on meter sockets or meter systems.

Certain exemplary embodiments provide a slide-in mechanism for resisting motion of the meter cover relative to the enclosure structure. Certain exemplary embodiments provide a locking position in which one or more prongs, when engaged in corresponding dogleg slots, can be configured to resist motion of the meter cover relative to the enclosure structure. Certain exemplary embodiments provide corresponding prongs and dogleg slots on both sides of one end of a meter cover to prevent the meter cover from lifting up relative to the enclosure structure.

FIG. 1 is a perspective view of an exemplary embodiment of a system 1000, which can comprise an electrical metering panel 1100. Electrical metering panel 1100 can be configured to measure an electrical parameter associated with electrical power provided by an electrical source 1200 to an electrical load 1300. Via electrical metering panel 1100, electrical source 1200 can be electrically coupled to electrical load 1300. Electrical metering panel 1100 can comprise a meter cover panel 1120 and an electrical meter 1180. Via electrical meter 1180, shielded by a meter cover 1190, a user can observe and/or obtain a value for the electrical parameter. Electrical metering panel 1100 can comprise a first pull cover section 1140 and a second pull cover section 1160. First pull cover section 1140, second pull cover section 1160, meter cover panel 1120, and meter cover 1190 can each be configured to restrict access of the user to electrical wiring and/or devices comprised in electrical metering panel 1100.

Figure 2:
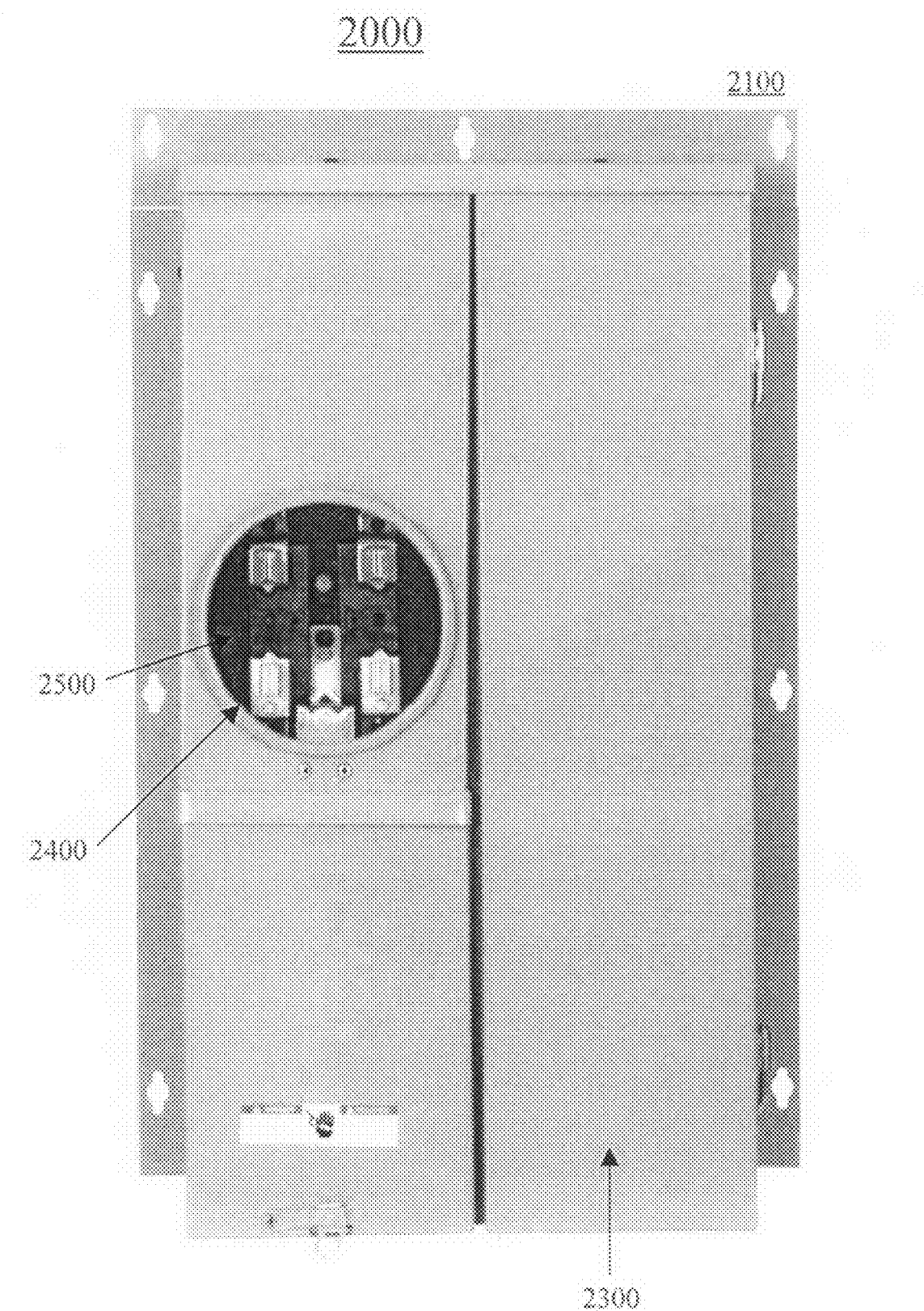
FIG. 2 is a block diagram of an exemplary embodiment of a system 2000.

FIG. 2 is a block diagram of an exemplary embodiment of a system 2000, which can comprise an enclosure structure 2100. Enclosure structure 2100 can be configured to restrict access to electrical components comprised in enclosure structure 2100. Enclosure structure 2100 can define a plurality of sides. The plurality of sides can comprise a meter access side 2300. Meter access side 2300 can define a meter port 2400. A meter cover 2500 can be configured to cover meter port 2400.

Figure 3:
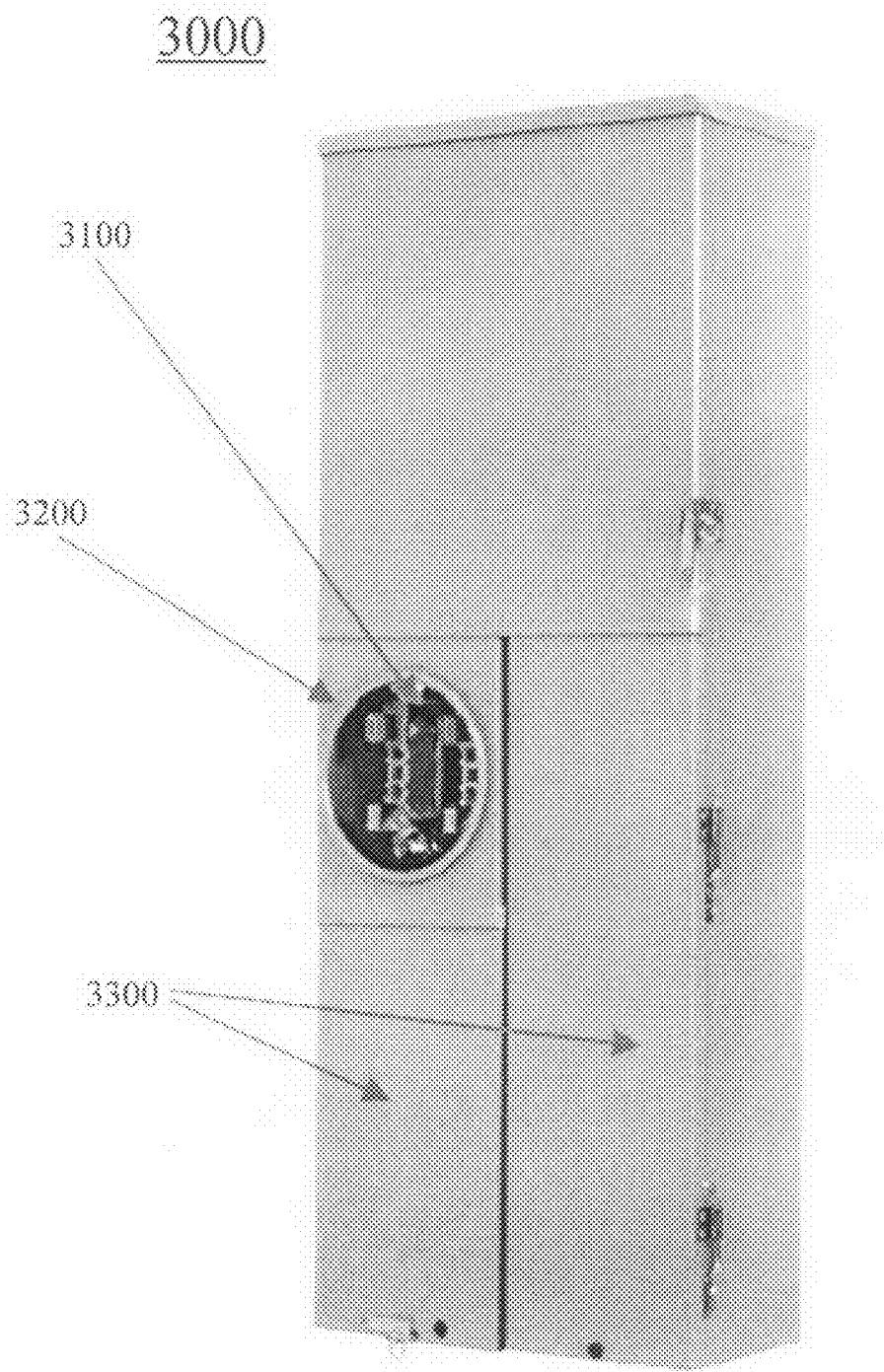
FIG. 3 is a perspective view of an exemplary embodiment of a system 3000.

FIG. 3 is a perspective view of an exemplary embodiment of a system 3000, which can comprise a cover bracket 3100, a meter cover 3200, and one or more pull section covers 3300.

Figure 4:
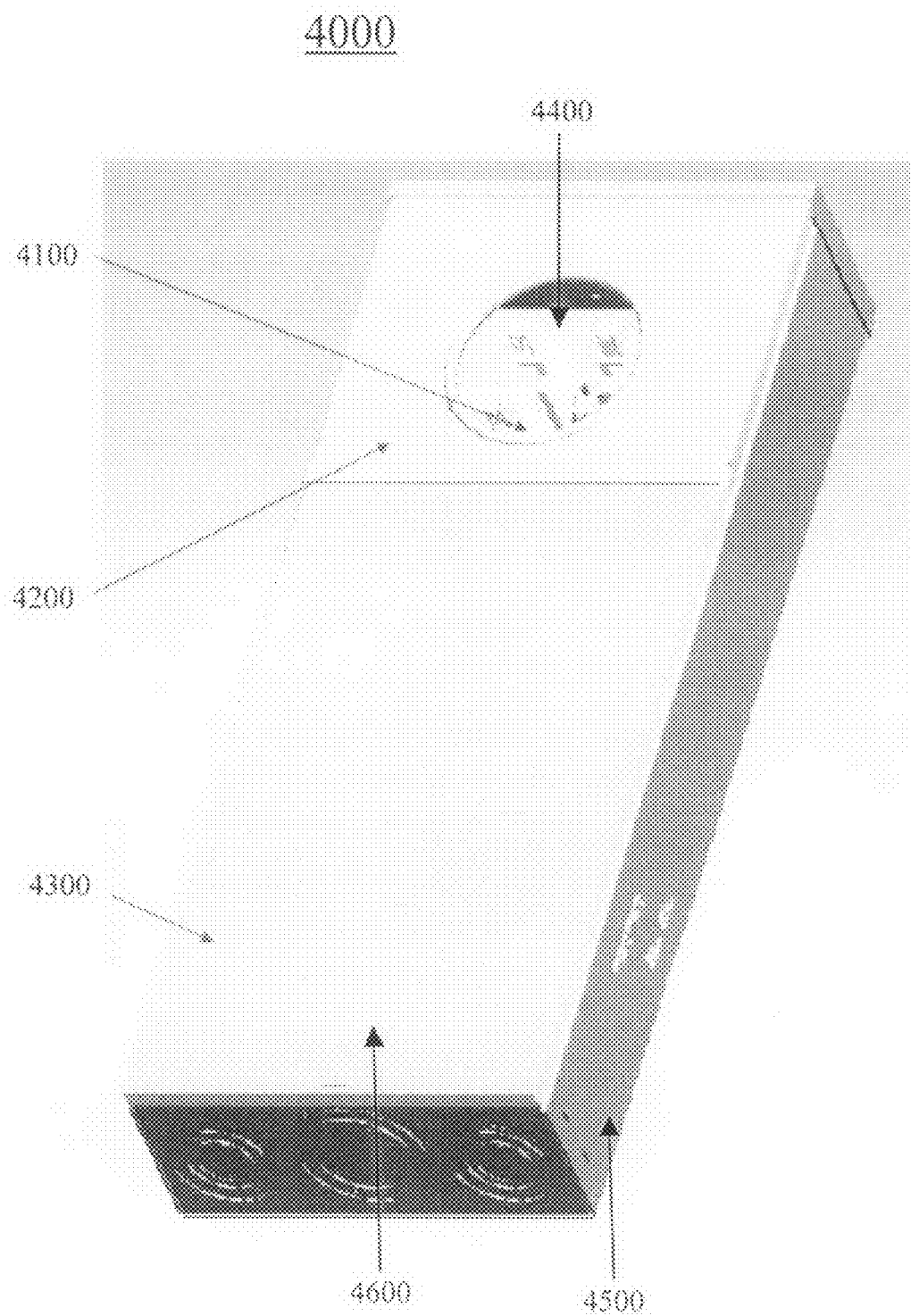
FIG. 4 is a perspective view of an exemplary embodiment of a system 4000.

FIG. 4 is a perspective view of an exemplary embodiment of a system 4000, which can comprise a cover bracket 4100. System 4000 can comprise a meter cover 4200. Meter cover 4200 can be configured to cover a meter port 4400 of an enclosure structure 4500. Enclosure structure 4500 can be configured to restrict access to an electrical meter configured to be placed in meter port 4400. Enclosure structure 4500 can define a plurality of sides. The plurality of sides can comprise a meter access side 4600, which can define meter port 4400. One of meter cover 4200 and enclosure structure 4500 can comprise an opposing pair of prongs, such as prong 2 of FIG. 7. Each of the prongs can be configured to be received by a corresponding dogleg slot from a pair of dogleg slots, such as dogleg slot 4 of FIG. 7. At least one of the pair of prongs can define a prong axis, such as prong axis A-A of FIG. 6, which can be substantially parallel to a plane defined by meter access side 4600 when meter cover 4200 is in an installed position. Each of the dogleg slots can be comprised in one of meter cover 4200 and enclosure structure 4500. Each of the prongs, when engaged with the corresponding dogleg slot, can be configured to restrain motion of meter cover 4200 in a direction substantially perpendicular to the prong axis. Meter cover 4200 can be configured to receive a fastener, such as fastener 8 of FIG. 6. The fastener can be configured to restrain rotational motion of meter cover 4200 substantially about the prong axis.

System 4000 can comprise a pull section cover 4300. Pull section cover 4300 can be configured to restrict access to a bus bar, electrical meter, electrical wire junctions, electrical sockets, and/or other electrical components comprised in system 4000.

Figure 5:
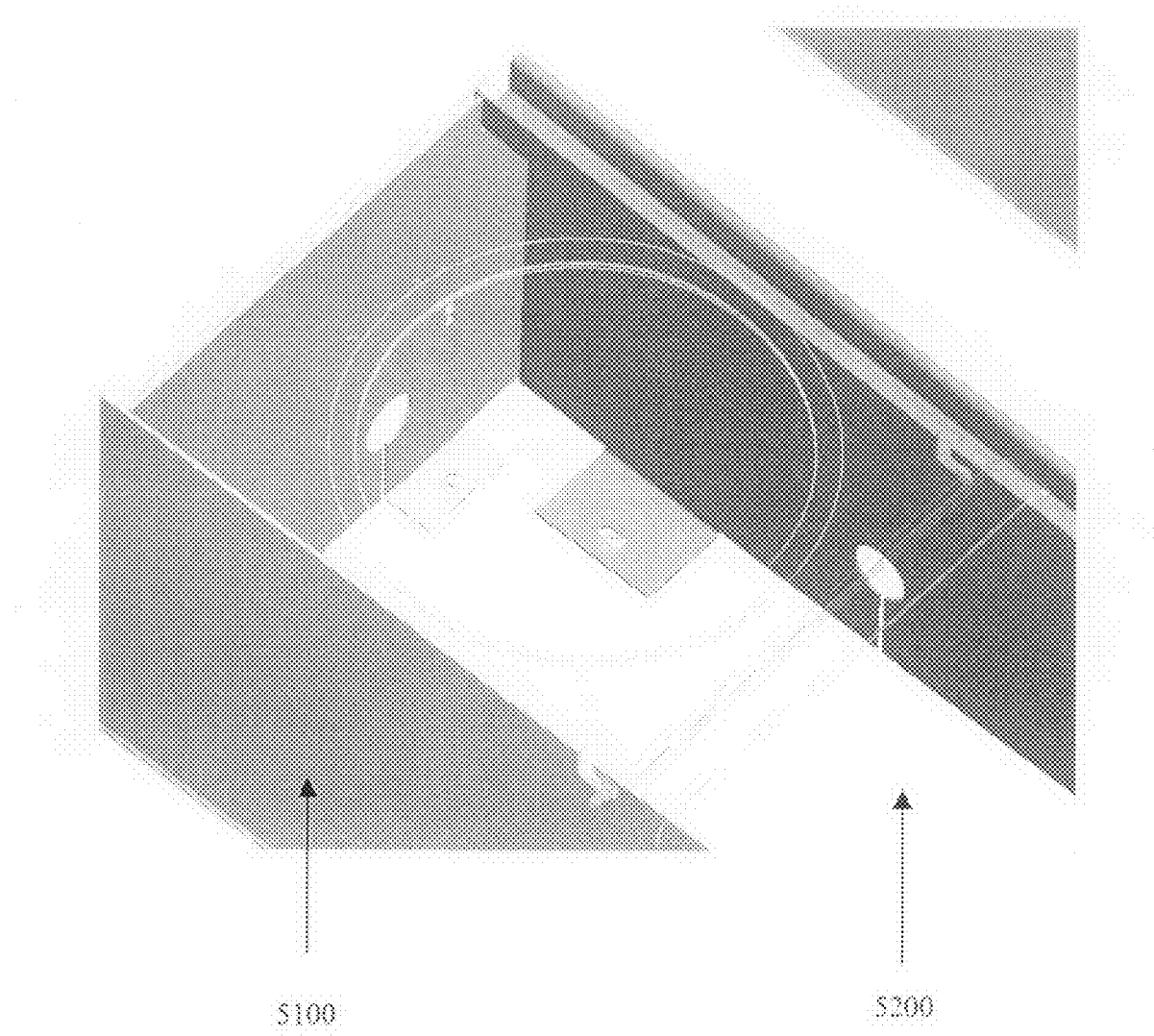
FIG. 5 is a perspective view of an exemplary embodiment of a system 5000.

FIG. 5 is a perspective view of an exemplary embodiment of a system 5000, which can comprise an enclosure structure 5100. Enclosure structure 5100 can comprise a base panel 5200. Base panel 5200 can be configured to receive an electrical meter (not illustrated) and/or a support structure (not illustrated) configured to receive the electrical meter. The electrical meter can be fastened to base panel 5200 and/or the support structure via one or more fasteners. The base panel can comprise an opening configured to be mounted to a supporting surface (not illustrated).

Figure 6:
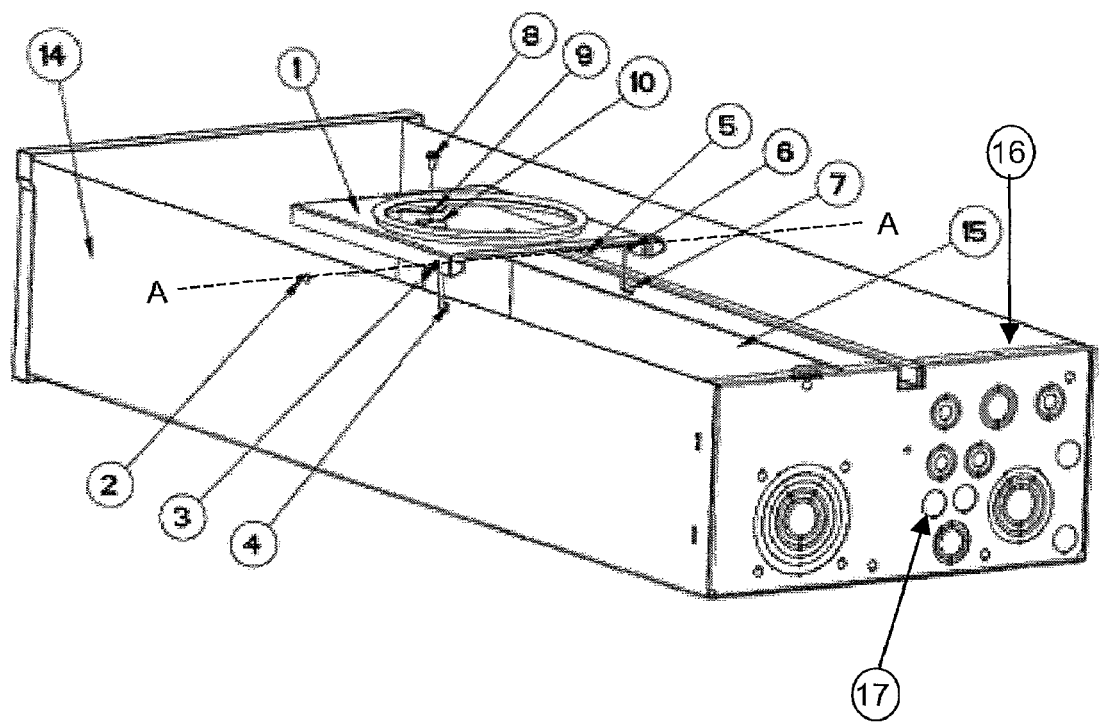
FIG. 6 is a perspective view of an exemplary embodiment of a system 6000.

FIG. 6 is a perspective view of an exemplary embodiment of a system 6000, which can comprise a meter cover 1. Meter cover 1 can comprise a first mounting hole 3 and a second mounting hole 6 on opposing sides of each side of a cover 1. Meter cover 1 can comprise a first prong 2 and a second prong 5. Meter cover 1 can be mounted to an enclosure structure 14 with first prong 2 and/or second prong 5 inside of an enclosure faceplate (not illustrated). First prong 2 can be slid into corresponding first dogleg slot 4 comprised in enclosure structure 14. Second prong 5 can be slid into corresponding second dogleg slot 7 on a barrier 15. A fastener 8 can be configured to fasten and/or secure a mounting bracket 9 on meter cover 1 to a holding bracket 10 preventing paralleled movement between cover 1, enclosure structure 14, and/or barrier 15, works with a "slid-in and secure" mechanism of certain exemplary embodiments to restrict motion of cover 1 relative to enclosure structure 14. Mounting bracket 9 can be configured to receive fastener 8.

One of meter cover 1 and enclosure structure 14 can comprise an opposing pair of prongs, such as first prong 2 and second prong 5. Each of first prong 2 and second prong 5 can be configured to be received by a corresponding dogleg slot from a pair of dogleg slots, such as first dogleg slot 4 and second dogleg slot 7. At least one of first prong 2 and second prong 5 can define a prong axis A-A substantially parallel to a plane defined by a meter access side 16 of enclosure structure 14 when meter cover 1 is in an installed position. Each of first dogleg slot 4 and second dogleg slot 7 can be comprised in one of meter cover 1 and enclosure structure 14. Each of first prong 2 and second prong 5, when engaged with corresponding dogleg slots, first dogleg slot 4 and second dogleg slot 7, can be configured to restrain motion of meter cover 1 in a direction substantially perpendicular to prong axis A-A. Meter cover 1 can be configured to receive fastener 8. Fastener 8, when installed, can be configured to restrain rotational motion of meter cover 1 substantially about prong axis A-A.

In certain exemplary embodiments, enclosure structure 14 can define one or more openings, such as opening 17. Opening 17 can be configured to receive one or more electrical wires. In certain exemplary embodiments, first dogleg slot 4 and/or second dogleg slot 7 can be wider than a diameter of corresponding first prong 2 and/or second prong 5. For example, first dogleg slot 4 and/or second dogleg slot 7 can be wider than a diameter of corresponding first prong 2 and/or second prong 5 by a percentage of approximately 1, 2.4, 3, 4.57, 7, 8.1, 9, 10, 14, 20, 21.1, 35, etc. and/or any value or subrange therebetween.

Figure 7:
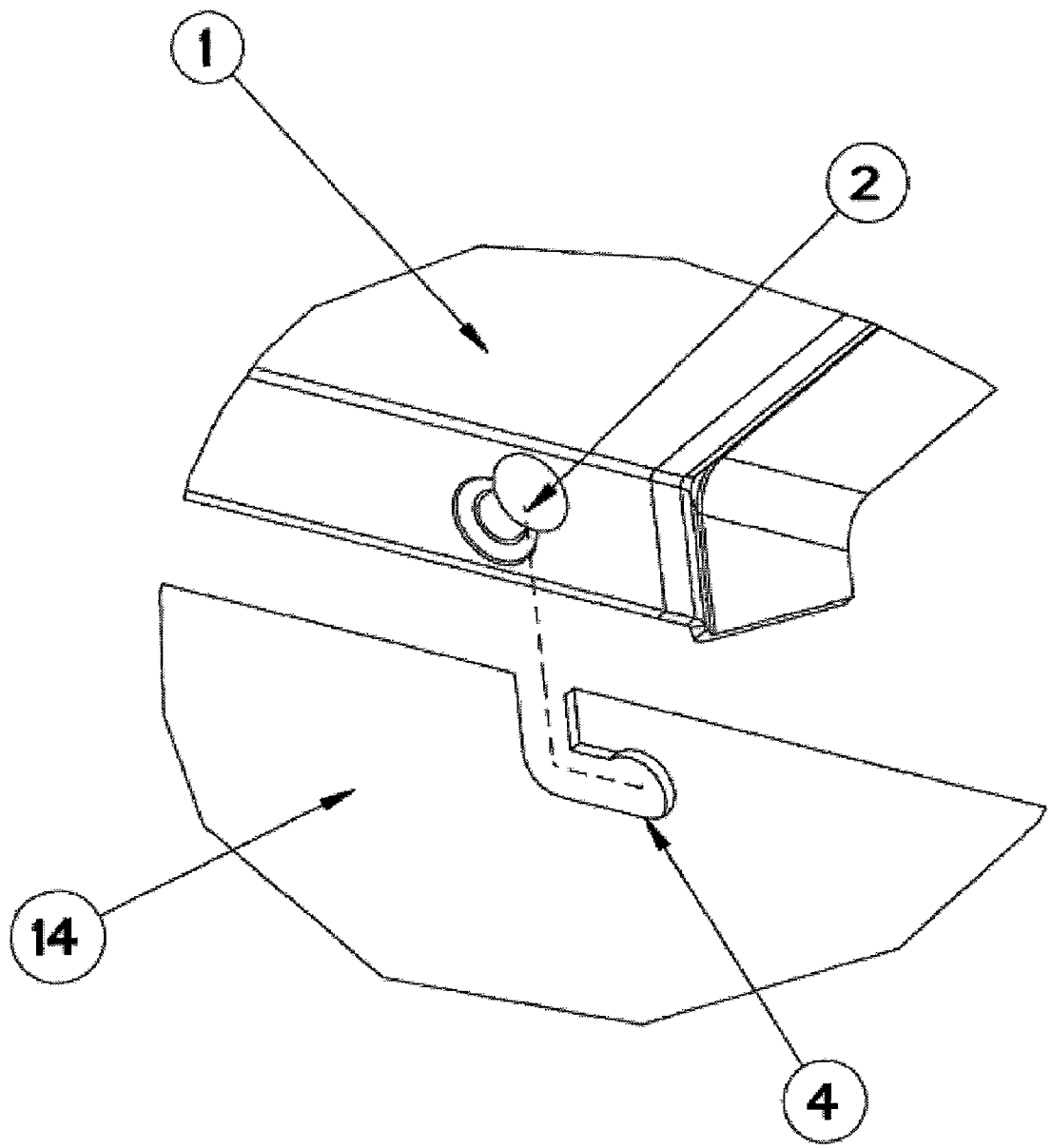
FIG. 7 is a perspective view of an exemplary embodiment of a system 7000.

FIG. 7 is a perspective view of an exemplary embodiment of a system 7000, which can comprise a meter cover 1 and a prong 2, which can be slid into a corresponding dogleg slot 4 on an edge of an enclosure structure 14. A potential sliding path, shown as a dashed line, corresponds to a direction of travel for interlocking meter cover 1 and enclosure structure 14.

Figure 8:
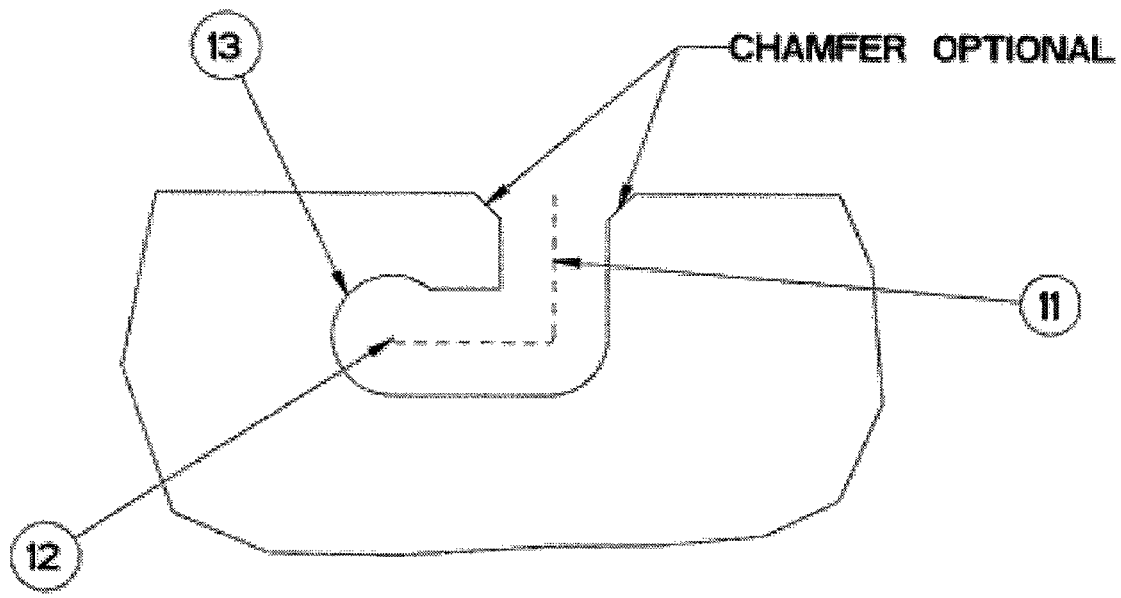
FIG. 8 is a side view of an exemplary embodiment of a dogleg slot 8000.

FIG. 8 is a side view of an exemplary embodiment of a dogleg slot system 8000, which can be dogleg slot 4 and/or dogleg slot 7 illustrated in FIG. 16. Dogleg slot system 8000 can comprise a substantially "L" shaped dogleg slot, which can define a sliding axis 11 from an open edge on an enclosure structure and can define a resting position 12. A profile of dogleg slot system 8000 can be configured to receive a corresponding prong of a meter cover. A motion of the prong can stop at resting position 12 when the prong is engaged with dogleg slot system 8000. An oversized end cut 13 can improve security of the prong. A small lift of the prong can be configured to resist a sliding motion of the prong out of dogleg slot system 8000. A direction of the substantial "L" shape can be oriented in a direction of sliding of the meter cover. In certain exemplary embodiments, dogleg slot system 8000 can define a chamfered opening.

Figure 9:
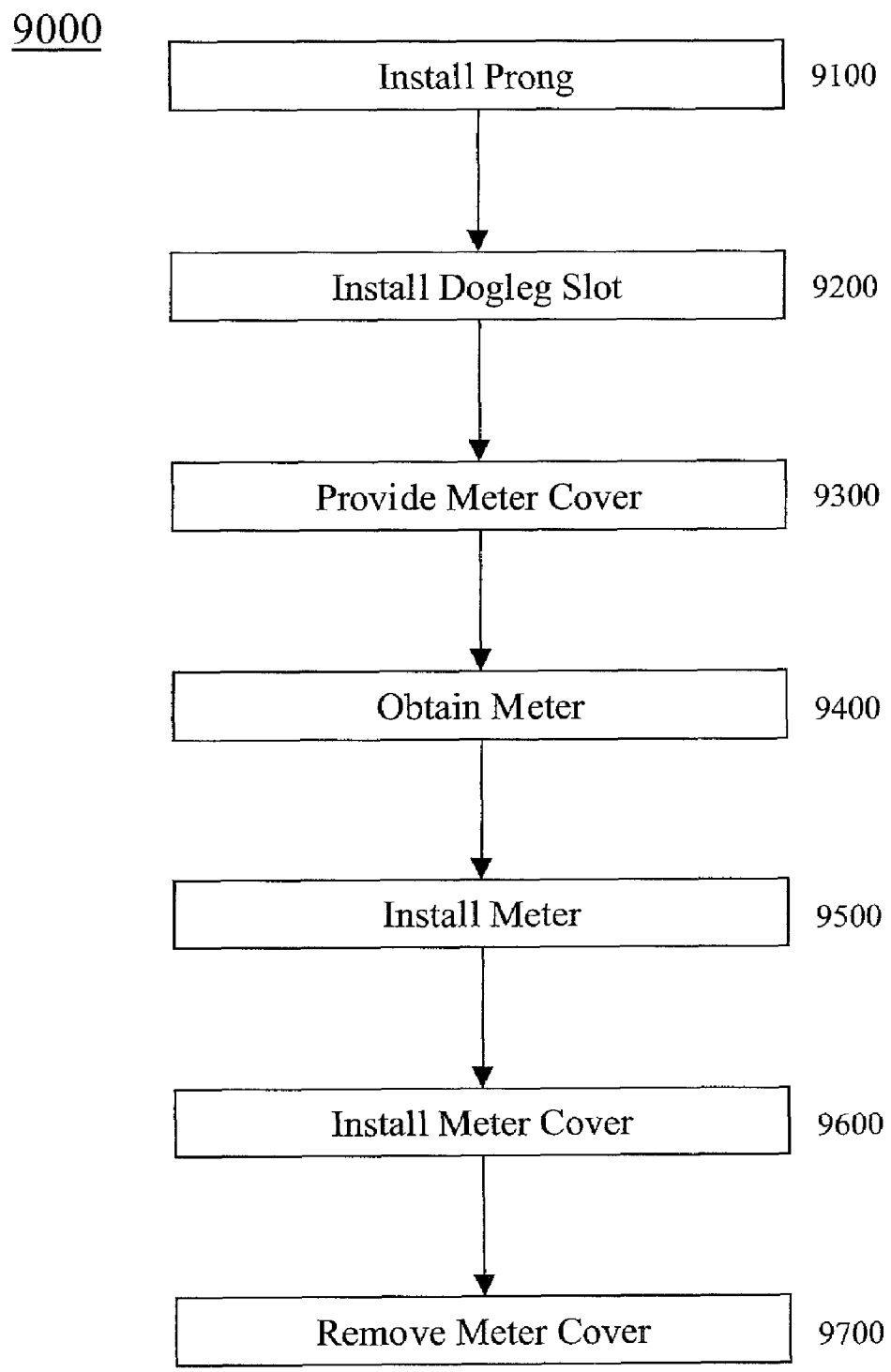
FIG. 9 is a flowchart of an exemplary embodiment of a method 9000.

FIG. 9 is a flowchart of an exemplary embodiment of a method 9000. At activity 9100, a prong can be installed. In certain exemplary embodiments the prong can be installed on a meter cover. In certain exemplary embodiments, the prong can be installed on an enclosure structure. For example, the prong can be welded, riveted, attached via threaded fastener, and/or cast as a part of the meter cover and/or the enclosure structure.

At activity 9200, a dogleg slot can be installed. In certain exemplary embodiments the dogleg slot can be installed on a meter cover. In certain exemplary embodiments, the dogleg slot can be installed on the enclosure structure. For example, the dogleg slot can be cut, machined, and/or cast into the meter cover and/or enclosure structure.

At activity 9300, a meter cover can be provided. The meter cover can be configured to cover a meter port of an enclosure structure. The enclosure structure can be configured to restrict access to an electrical meter. The enclosure structure can define a plurality of sides. The plurality of sides can comprise a meter access side, which can define a meter port. One of the meter cover and the enclosure structure can comprise an opposing pair of prongs. Each of the prongs can be configured to be received by a corresponding dogleg slot from a pair of dogleg slots. At least one of the pair of prongs can define a prong axis substantially parallel to a plane defined by the meter access side of the enclosure structure. Each of the dogleg slots can be comprised in one of the meter cover and the enclosure structure. Each of the prongs, when engaged with the corresponding dogleg slot, can be configured to restrain motion of the meter cover in a direction substantially perpendicular to the prong axis. The meter cover can be configured to receive a fastener, which can be configured to restrain rotational motion of the meter cover substantially about the prong axis.

At activity 9400, an electrical meter can be obtained. For example, the electrical meter can be obtained from a manufacturer, distributor, and/or retail supplier for use in the enclosure structure.

At activity 9500, the electrical meter can be installed. For example, the electrical meter can be installed in the enclosure structure. The electrical meter can be installed via a plug and socket arrangement, via one or more fasteners, via a threads on the electrical meter, and/or via welding, etc.

At activity 9600, the meter cover can be installed. For example, the meter cover can be installed on the enclosure structure. In certain exemplary embodiments, the meter cover can be installed via slidably moving a prong to a base of a dogleg slot. The meter cover can be secured via one or more threaded fasteners configured to restrain motion of the meter cover relative to the enclosure structure.

At activity 9700, the meter cover can be removed. For example, the meter cover can be removed from an installed position on the enclosure structure. In certain exemplary embodiments, the one or more fasteners restraining motion of the meter cover relative to the enclosure structure can be removed. One or more prongs utilized for releasably attaching the meter cover to the enclosure structure can be moved from a first installed position to a second released position, thereby disengaging the prong from the dogleg slot.

Still other practical and useful embodiments will become readily apparent to those skilled in this art from reading the above-recited detailed description and drawings of certain exemplary embodiments. It should be understood that numerous variations, modifications, and additional embodiments are possible, and accordingly, all such variations, modifications, and embodiments are to be regarded as being within the spirit and scope of this application.

Thus, regardless of the content of any portion (e.g., title, field, background, summary, abstract, drawing figure, etc.) of this application, unless clearly specified to the contrary, such as via an explicit definition, assertion, or argument, with respect to any claim, whether of this application and/or any claim of any application claiming priority hereto, and whether originally presented or otherwise:

- there is no requirement for the inclusion of any particular described or illustrated characteristic, function, activity, or element, any particular sequence of activities, or any particular interrelationship of elements;
- any elements can be integrated, segregated, and/or duplicated;
- any activity can be repeated, performed by multiple entities, and/or performed in multiple jurisdictions; and
- any activity or element can be specifically excluded, the sequence of activities can vary, and/or the interrelationship of elements can vary.

Accordingly, the descriptions and drawings are to be regarded as illustrative in nature, and not as restrictive. Moreover, when any number or range is described herein, unless clearly stated otherwise, that number or range is approximate. When any range is described herein, unless clearly stated otherwise, that range includes all values therein and all subranges therein. Any information in any material (e.g., a United States patent, United States patent application, book, article, etc.) that has been incorporated by reference herein, is only incorporated by reference to the extent that no conflict exists between such information and the other statements and drawings set forth herein. In the event of such conflict, including a conflict that would render invalid any claim herein or seeking priority hereto, then any such conflicting information in such incorporated by reference material is specifically not incorporated by reference herein.

What is claimed is:

1. A system comprising:
    an enclosure structure configured to restrict access to an electrical meter, said enclosure structure defining a plurality of sides, said plurality of sides comprising a meter access side, said meter access side defining a meter port, access to an inside of said enclosure structure from said meter access side adapted to be restricted by a pull section cover;
    a meter cover configured to cover said meter port;
    one of said meter cover and said enclosure structure comprising an opposing pair of prongs, each of said prongs configured to be received by a corresponding dogleg slot from a pair of dog leg slots of one of said meter cover and said enclosure structure, each of said pair of dogleg slots a substantially "L"-shaped channel defining a first axis between a vertex and a centerline of an opening of the channel, the "L"-shaped channel defining a second axis between the vertex and a base centerline of the "L"-shaped channel, the first axis intersecting the second axis at an angle between approximately 45 degrees and approximately 135 degrees, at least one of said prongs defining a prong axis substantially parallel to a plane defined by said meter access side, each of said dogleg slots comprised in one of said meter cover and said enclosure structure, each of said prongs, when engaged with said corresponding dogleg slot, configured to restrain motion of said meter cover in a direction substantially perpendicular to said prong axis, said meter cover configured to receive a fastener configured to restrain rotational motion of said meter cover substantially about said prong; and a portion of one of said meter cover and said pull section cover adapted to overlap said meter cover or said pull section cover such that said meter cover is restricted from opening more than approximately ¼ inch in a direction substantially perpendicular to said prong axis when said pull section cover is operatively coupled to said enclosure structure.

2. The system of claim 1, further comprising:
said fastener.

3. The system of claim 1, further comprising:
a base panel configured to receive said electrical meter.

4. The system of claim 1, further comprising:
a base panel configured to receive said electrical meter; and
a plurality of fasteners configured to mount said electrical meter in said enclosure structure.

5. The system of claim 1, further comprising:
a base panel configured to receive said electrical meter, said base panel comprising an opening configured to be mounted to a supporting surface.

6. The system of claim 1, further comprising:
a mounting bracket configured to receive said fastener.

7. The system of claim 1, wherein said enclosure structure defines an opening configured to receive an electrical wire.

8. The system of claim 1, wherein one of said meter cover and said enclosure structure comprises a second prong configured to be received by a second dogleg slot, said second dogleg slot comprised in one of said meter cover and said enclosure structure, one of said second prong and said second dogleg slot on an opposing surface of said meter cover relative to one of a first prong of said opposing pair of prongs and a first dogleg slot of said pair of dogleg slots.

9. The system of claim 1, wherein a first dogleg slot of said pair of dogleg slots is more than approximately ten percent wider than a diameter of a first prong of said pair of prongs.

10. The system of claim 1, wherein a first dogleg slot of said pair of dogleg slots defines a chamfered opening.

11. A method comprising:
providing a meter cover configured to cover a meter port of an enclosure structure, said enclosure structure configured to restrict access to an electrical meter, said enclosure structure defining a plurality of sides, said plurality of sides comprising a meter access side, access to an inside of said enclosure structure from said meter access side adapted to be restricted by a pull section cover, said meter access side defining the meter port, one of said meter cover and said enclosure structure comprising an opposing pair of prongs, each of said prongs configured to be received by a corresponding dogleg slot from a pair of dogleg slots of one of said meter cover and said enclosure structure, each of said pair of dogleg slots a substantially "L"-shaped channel defining a first axis between a vertex and a centerline of an opening of the channel, the "L"-shaped channel defining a second axis between the vertex and a base centerline of the "L"-shaped channel, the first axis intersecting the second axis at an angle between approximately 45 degrees and approximately 135 degrees, at least one of said pair of prongs defining a prong axis substantially parallel to a plane defined by said meter access side, each of said dogleg slots comprised in one of said meter cover and said enclosure structure, each of said prongs, when engaged with said corresponding dogleg slot, configured in restrain motion of said meter cover in a direction substantially perpendicular to said prong axis, said meter cover configured to receive a fastener configured to restrain rotational motion of said meter cover substantially about said prong axis, and a portion of one of said meter cover and said pull section cover adapted to overlap said meter cover or said pull section cover such that said meter cover is restricted from opening more than approximately ¼ inch in a direction substantially perpendicular to said prong axis when said pull section cover is operatively coupled to said enclosure structure.

12. The method of claim 11, further comprising:
obtaining said electrical meter.

13. The method of claim 11, further comprising:
installing said electrical meter in said enclosure structure.

14. The method of claim 11, further comprising:
installing said meter cover on said enclosure structure.

15. The method of claim 11, further comprising:
removing said meter cover from an installed position on said enclosure structure.

16. The method of claim 11, further comprising:
installing a prong of said pair of prongs on said meter cover.

17. The method of claim 11, further comprising:
installing a dogleg slot of said pair of dogleg slots on said meter cover.

18. A device comprising:
a meter cover configured to cover a meter port of an enclosure structure, said enclosure structure configured to restrict access to an electrical meter, said enclosure structure defining a plurality of sides, said plurality of sides comprising a meter access side, access to an inside of said enclosure structure from said meter access side adapted to be restricted by a pull section cover, said meter access side defining the meter port, one of said meter cover and said enclosure structure comprising an opposing pair of prongs, each of said prongs configured to be received by a corresponding dogleg slot from a pair of dogleg slots of one of said meter cover and said enclosure structure, each of said pair of dogleg slots a substantially "L"-shaped channel defining a first axis between a vertex and a centerline of an opening of the channel, the "L"-shaped channel defining a second axis between the vertex and a base centerline of the "L"-shaped channel, the first axis intersecting the second axis at an angle between approximately 45 degrees and approximately 135 degrees, at least one of said pair of prongs defining a prong axis substantially parallel to a plane defined by said meter access side, each of said dogleg slots comprised in one of said meter cover and said enclosure structure, each of said prongs, when engaged with said corresponding dogleg slot, configured to restrain motion of said meter cover in a direction substantially perpendicular to said prong axis, said meter cover configured to receive a fastener configured to restrain rotational motion of said meter cover substantially about said prong axis, and a portion of one of said meter cover and said pull section cover adapted to overlap said meter cover or said pull section cover such that said meter cover is restricted from opening more than approximately ¼ inch in a direction substantially perpendicular to said prong axis when said pull section cover is operatively coupled to said enclosure structure.

* * * * *